US006940009B2

(12) United States Patent
Damian Alvarez

(10) Patent No.: US 6,940,009 B2
(45) Date of Patent: Sep. 6, 2005

(54) SOLAR CELL

(76) Inventor: Juan Jose Damian Alvarez, 01260 Mezquia, Mezquia, Alava (ES), 01260

( * ) Notice: Subject to any disclaimer, the term of this patent is extended or adjusted under 35 U.S.C. 154(b) by 0 days.

(21) Appl. No.: 10/486,567

(22) PCT Filed: Aug. 6, 2002

(86) PCT No.: PCT/ES02/00395

§ 371 (c)(1),
(2), (4) Date: Feb. 9, 2004

(87) PCT Pub. No.: WO03/017375

PCT Pub. Date: Feb. 27, 2003

(65) Prior Publication Data

US 2004/0200521 A1 Oct. 14, 2004

(30) Foreign Application Priority Data

Aug. 9, 2001 (ES) .......................................... 200101876

(51) Int. Cl.[7] ...................... H01L 31/032; H01L 31/058
(52) U.S. Cl. ...................... 136/252; 136/261; 136/244; 136/256; 257/461; 257/463; 257/431
(58) Field of Search ................................. 136/252, 261, 136/244, 256; 257/461, 463, 431

(56) References Cited

U.S. PATENT DOCUMENTS 2,067,100 A * 1/1937 Schonhofer et al. .......... 556/10
3,977,071 A * 8/1976 Jarman ........................ 438/67
5,326,719 A   7/1994 Green et al. ................. 438/479

FOREIGN PATENT DOCUMENTS

EP    744779 A2 * 11/1996
JP    59-168678 A * 9/1984

OTHER PUBLICATIONS

International Search Report, dated Dec. 5, 2002.

* cited by examiner

Primary Examiner—Alan Diamond
(74) Attorney, Agent, or Firm—Ostrolenk, Faber, Gerb & Soffen, LLP

(57) ABSTRACT

Improved solar cell composed of an upper layer or mesh of a conductive nature, a lower layer or mesh also of a conductive nature, and a series of intermediate semiconductor layers composed of a mixture of silicon, mercury and silver nitrate.

3 Claims, 1 Drawing Sheet

SOLAR CELL

The present invention refers to a solar cell consisting of a solar panel which is used for converting solar energy into electric energy.

PRIOR ART

We are already familiar with the use of solar panels composed of a plurality of solar cells, which make use of the photovoltaic effect to convert energy from the sun into electric energy.

Solar radiation is composed of photons, which are particles that have a variable energy depending on the wavelength of the emissions in the solar spectrum. When the photons fall onto the surface of the semiconductor material forming a photovoltaic cell they may either be reflected, absorbed or pass through the cell.

There are certain materials that, upon absorbing this type of radiation, generate positive and negative charge couples, i.e. electrons (e−) and holes (h+), which, on being produced, move randomly though the volume of the solid and, if there is no external or internal determining factor, the opposing sign charges recombine and neutralize each other mutually. On the other hand, if a permanent electric field is created in the interior of the material, the positive and negative charges will be separated by this field, which produces a difference of potential between the two areas of material.

If these two areas are interconnected by means of an external circuit, at the same time as the solar radiation falls onto the material an electric current will be produced that will run round the external circuit.

The most important parts of a solar cell are the intermediate layers made up of semiconductor materials, as it is at the heart of materials of this type where the electron current proper is created. These semiconductors are specially treated to form two layers in contact with each other, which are doped differently (type p and type n) to form a positive electric field on one side and a negative one on the other. In addition, solar cells are formed of an upper layer or mesh composed of an electrically-conductive material, which has the function of collecting the electrons from the semiconductor and transferring them to the outer circuit and a lower layer or mesh of electrically-conductive material, which has the function of completing the electric circuit.

At the top of the cell too it is also usual to have an encapsulating transparent material to seal the cell and protect it from unfavourable environmental conditions and it may also be provided with a reflection-inhibiting layer in order to increase the proportion of radiation absorbed.

The cells are usually connected to one another, encapsulated and mounted on a structure in the form of a carrier or frame, thereby shaping the solar panel.

All the panels known hitherto usually collect solar radiation during the hours in which the sun radiates its rays over the Earth. This range of time is usually variable according to the longitude and latitude of each geographical point, while it also varies depending on the season of the year we are in.

The period of absorption and conversion of solar energy into electric energy is therefore limited to the time band during which the sun emits solar rays towards the Earth, and no radiation can be converted into electric energy outside this time band, wherefore the performance of cells of this type is greatly reduced by this circumstance.

DESCRIPTION OF THE INVENTION

The object of the present invention is to overcome the problems outlined by introducing a series of improvements in order to be able to solve the problems faced in the most satisfactory way possible.

In order to solve the problems faced more specifically, the idea has been devised to add a certain amount of mercury and silver nitrate to the semiconductor material making up the cell, which is usually silicon and may be found in different crystalline states.

The former materials have the capacity to absorb certain amounts of energy during the hours of solar ray emission, which are then released outside the hours that solar rays are emitted, whereby we secure a reception of energy from the semiconductor materials which is prolonged over a longer period outside the hours of solar ray emission, thus achieving an enhanced performance and improved harnessing of solar energy.

For the construction of the solar cells that are the object of this invention, materials are taken that will constitute the cell proper, namely a mixture of silicon in any of its known crystalline states, silver nitrate and mercury.

The mixing of the three compounds is done with the silicon and silver nitrate in powder form, which are then combined with the mercury for subsequent encapsulating to form the corresponding cells.

To obtain optimum performance in the operation of the cells, the three components making up the cells have to be present in specific proportions, which is to be as follows:

40% to 65% mercury

8% to 20% silver nitrate

15% to 30% silicon

BRIEF DESCRIPTION OF THE DRAWINGS

To complete the description being offered and in order to facilitate a clearer understanding of the features of the invention, the present descriptive report is accompanied, as an integral part thereof, by some figures in which there is represented, for purely informative and non-restrictive purposes, the following.

PREFERRED EMBODIMENT OF THE INVENTION

Figure 1:
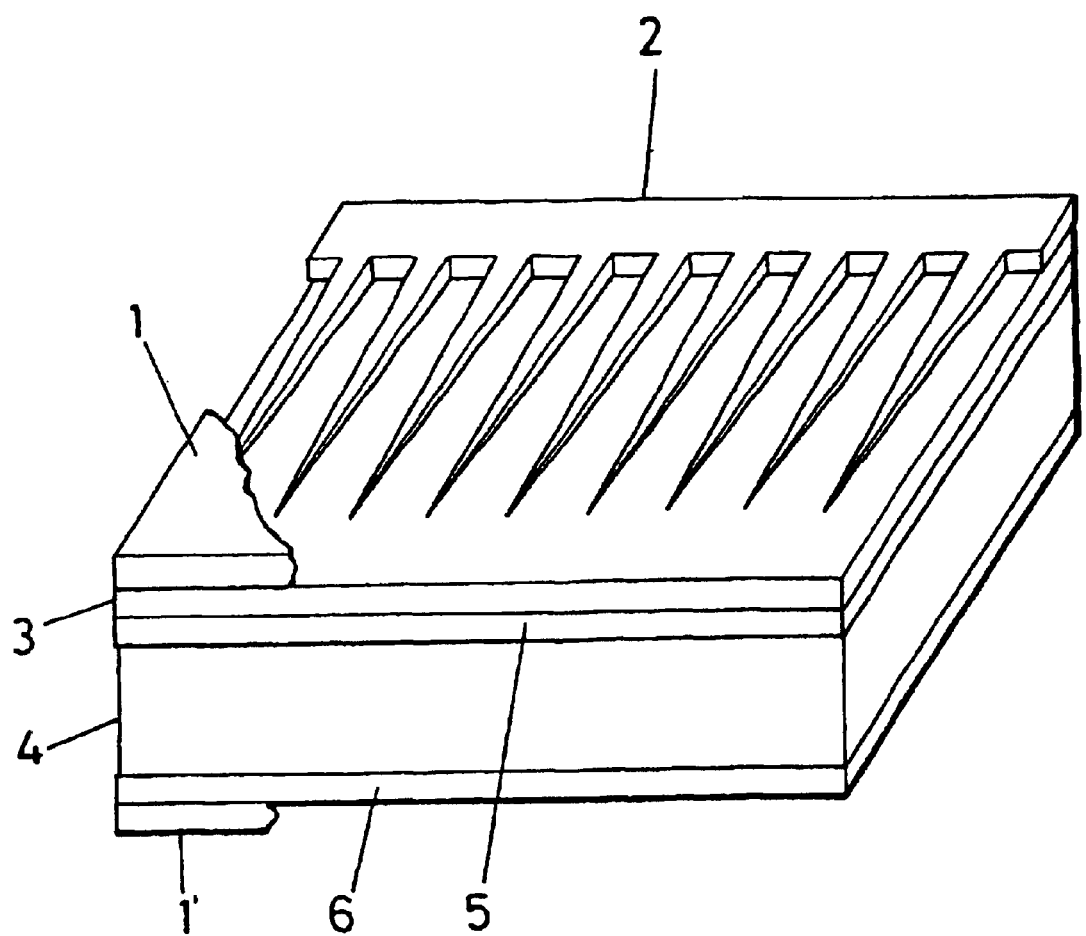
FIG. 1 is a perspective view of a portion of a solar cell.

FIG. 1 shows a perspective view of the layout of a portion of a cell, which is composed on its two outermost sides of a pair of layers 1 and 1' of a transparent encapsulating material in order to seal the cell and protect it from unfavourable environmental conditions, below which are arranged respectively an upper layer or mesh 2 and a lower layer or mesh 6, composed of a material that is a conductor of electricity, which has the mission of collecting the electrons from layers 3 and 4, of semiconductor material, which are placed in contact with each other by way of a middle layer 5, said layers of semiconductor material 3 and 4 being doped differently, the upper layer 3 doped positively, whereas the lower layer is doped negatively, so that a positive electric field is formed on the outermost side of the upper layer 3 of semiconductor material, which is in contact with the upper mesh 2, and a negative electric field on the outermost side of the lower layer 4 of semiconductor material, which is in contact with the lower mesh 6.

The layers 3 and 4 are composed of a mixture of silicon, mercury and silver nitrate.

Both the mercury and the silver nitrate have the capacity to absorb certain amounts of energy during the hours of solar ray emission, which are then released outside the hours of solar ray emission, whereby we secure a reception of energy from the semiconductor materials which will be prolonged over a longer period outside the hours of solar ray emission, thus achieving enhanced performance and improved harnessing of solar energy.

What is claimed is:

1. A solar cell comprising a series of intermediate semiconductor layers with each intermediate layer on another intermediate layer; an upper layer or mesh of a conductive material, and a lower layer or mesh also of a conductive material, wherein the intermediate semiconductor layers are comprised of a mixture of silicon, mercury and silver nitrate.

2. The solar cell according to claim 1, wherein the material of each of the intermediate layers comprises a mixture by weight of a proportion of mercury ranging from 40% to 65%, a proportion of silver nitrate ranging from 8% to 20%, and a proportion of silicon ranging from 15% to 30%.

3. The solar panel of claim 1, further comprising layers of transparent encapsulating material on each of the upper and the lower layers.

* * * * *